United States Patent
Chiu et al.

(10) Patent No.: US 6,993,464 B2
(45) Date of Patent: Jan. 31, 2006

(54) OPTIMIZED FILTER PARAMETERS DESIGN FOR DIGITAL IF PROGRAMMABLE DOWNCONVERTER

(75) Inventors: Che-Sheng Chiu, Taoyuan (TW); Kai-An Tang, Taoyuan (TW); Su-Chin Hsieh, Taoyuan (TW); Chiung-Jang Chen, Taoyuan (TW)

(73) Assignee: Chunghwa Telecom Co., Ltd., Taoyuan (TW)

( * ) Notice: Subject to any disclaimer, the term of this patent is extended or adjusted under 35 U.S.C. 154(b) by 428 days.

(21) Appl. No.: 10/308,089

(22) Filed: Dec. 3, 2002

(65) Prior Publication Data

US 2004/0107078 A1 Jun. 3, 2004

(51) Int. Cl.
  *G06F 17/50* (2006.01)
  *G06F 17/17* (2006.01)
(52) U.S. Cl. .............................. 703/2; 703/13; 708/300; 455/422.1
(58) Field of Classification Search ................... 703/2, 703/6, 13; 708/300, 313, 319; 341/143; 375/295; 455/422.1

See application file for complete search history.

(56) References Cited

U.S. PATENT DOCUMENTS

| | | | |
|---|---|---|---|
| 6,279,019 B1 * | 8/2001 | Oh et al. ..................... | 708/300 |
| 6,289,487 B1 * | 9/2001 | Hessel et al. ............... | 714/795 |
| 6,611,855 B1 * | 8/2003 | Hellberg et al. ............ | 708/420 |
| 2004/0203709 A1 * | 10/2004 | Luneau .................... | 455/422.1 |

* cited by examiner

Primary Examiner—Thai Phan
(74) Attorney, Agent, or Firm—Rabin & Berdo, P.C.

(57) ABSTRACT

The present invention discloses a method for finding an optimized filter parameters design to meet input specifications and hardware constraints in accordance with a typical single channel digital IF programmable downconverter. Said typical single channel digital IF programmable downconverter comprises four stages, including a high speed down-sampling stage, a spectral shaping stage, a rate matching stage and an oversampling stage. According to input specifications, said method firstly determines a number of Halfband interpolation filters used in said oversampling stage, secondly obtains optimized parameters for a CIC decimation filter and a Halfband decimation filter in said high speed down-sampling stage, using as many Halfband decimation filters as possible. Then determine if it is necessary to use re-sampling FIR filter for rate matching. Finally, use various function window to design programmable FIR filter for spectral shaping, obtains an overall synthesized spectral response which meets input specifications.

13 Claims, 3 Drawing Sheets

OPTIMIZED FILTER PARAMETERS DESIGN FOR DIGITAL IF PROGRAMMABLE DOWNCONVERTER

BACKGROUND OF THE INVENTION

1. Field of the Invention

The present invention is related to an optimized filter parameters design for digital IF programmable downconverter, and more particularly, to an optimized filter parameters design for a single channel digital IF programmable downconverter meeting input specifications and hardware constraints.

2. Description of the Prior Art

Software radio is a technique using software to reconfigure radio equipment to integrate different communication standards and to provide different communication services. The basic concept is to design the analog-to-digital converter (ADC) as close to the antenna modules as possible to digitize the received signal from antenna for further processing.

Due to the rapid development of broadband ADC technique and high-speed digital signal processing, it is now viable to sample and process the digital signal at intermediate frequency (IF) band. Digital IF technique plays an important role in software radio system because it can provide greater flexibility and higher efficiency compared to traditional analog circuit in specifications such as attenuation, selectivity and stability. A digital IF circuit in a typical software radio system comprises an ADC for sampling IF signal, a numerically controlled oscillator (NCO) for downconverting a digital IF signal into a baseband signal and a digital IF programmable downconverter for downconverting and filtering. Because of the high IF sampling rate, digital IF programmable downconverter is used to reduce the sampling rate and to filter out unwanted frequency bands.

Two major manufacturers, Intersil and GRAYCHIP, are providing hardware implemented with digital IF technique. The digital IF programmable downconverter products currently in the market are GRAYCHIP's GC4014 and GC4016 digital downconverters, and Intersil's HSP50016, HSP50214, HSP50216 and ISL50216 digital downconverters. Intersil's product family provides better control capability and programmability. HSP50016 digital downconverter is widely adopted since 1994, HSP50214 programmable digital downconverter rolled out in 1997, is highly programmable and suitable for narrow-band applications. Moreover, based on HSP50214 programmable digital downconverter, HSP50216 and ISL5216 digital downconverter are multi-channel products configured to use in wideband communication systems, however, they are not related to the present invention.

A typical single channel digital IF programmable downconverter comprises four stages, including high speed down-sampling stage, spectral shaping stage, rate matching stage and oversampling stage. The high speed down-sampling stage uses simple Decimation filters, such as CIC (Cascaded Integrator-Comb) filter and Halfband filter for down-sampling. In the spectral shaping stage, one or more programmable FIR filters are used to re-shape and filter the output signal in digital downconverter, therefore the sampling rate of the input signal should conform to Nyquist sampling theory to get as many available taps of programmable FIR filter as possible. In the rate matching stage, fractional decimation filter or re-sampling FIR filter is used to achieve a non-integer decimation, wherein the output sampling rate is able to be adapted to user-specified sampling rate. The oversampling stage consists of a few interpolation filters, the main function of the oversampling stage is to enable programmable FIR filters in the spectral shaping stage to operate at a lower sampling rate to increase the available number of taps of programmable FIR filter.

According to the above-mentioned introduction of typical single channel digital IF programmable downconverter, it is difficult to provide an optimal design based on different types of filters.

In view of the above-described difficulty and complexity in designing a typical single channel digital IF programmable downconverter, after years of constant effort in research, the inventor of this invention has consequently developed and proposed an optimized filter parameters design for digital IF programmable downconverter

SUMMARY OF THE INVENTION

The object of the present invention is to provide an optimized filter parameters design for digital IF programmable downconverter, based on input signal sampling rate, input data rate, oversampling factor, available number of Halfband decimation filter, passband frequency, stopband frequency, passband ripple and stopband attenuation, to automatically design the parameters of CIC decimation filter, Halfband decimation filter, programmable FIR filter, re-sampling FIR filter and Halfband interpolation filter of a typical single channel digital IF programmable downconverter having output signal bandwidth and data rate satisfying the input specifications.

It is another object of the present invention is to provide an optimized filter parameters design for digital IF programmable downconverter to implement digital IF techniques using digital downconverters and to avoid the complexity and difficulty in designing various filter stages.

The present invention discloses an optimized filter parameters design for digital IF programmable downconverter, based on user's requirements, such as input signal sampling rate, input data rate, oversampling factor, available number of Halfband decimation filter, passband frequency, stopband frequency, passband ripple and stopband attenuation to automatically design the parameters of various filter stages of a typical single channel digital IF programmable downconverter having output signal bandwidth and data rate satisfying the input specifications.

Firstly, determine if it is necessary to use Halfband Interpolation filter and the number thereof based on oversampling factor. Secondly, find out the largest available number of Halfband decimation filter and the possible combinations thereof according to input specifications. Using the possible combinations of Halfband decimation filter, determine the priorities of all possible combinations based on their alias rejection capability, passband attenuation and full dynamic range bandwidth. Staring from the combination of Halfband decimation filters having the highest priority, find out the combination that satisfies the hardware constraints and obtain the corresponding decimation factor of CIC Decimation filter. After the best combination of Halfband Decimation filters and CIC Decimation filters is obtained, then determine if it is necessary to use re-sampling FIR filter. Finally, design the programmable FIR filter using several window functions, determining if the resulted synthesized frequency response of all filters satisfies the input specifications.

The present invention discloses an optimized filter parameters design for digital IF programmable downconverter, based on input specifications, to find out the largest available number of Halfband decimation filters and the optimized parameters of CIC decimation filters and Halfband decimation filters. This method guarantees the largest available number of taps of programmable FIR filter.

BRIEF DESCRIPTION OF THE DRAWINGS

The drawings disclose an illustrative embodiment of the present invention, which serves to exemplify the various advantages and objects hereof, and are as follows.

DETAILED DESCRIPTION OF THE PREFERRED EMBODIMENT

Figure 1:
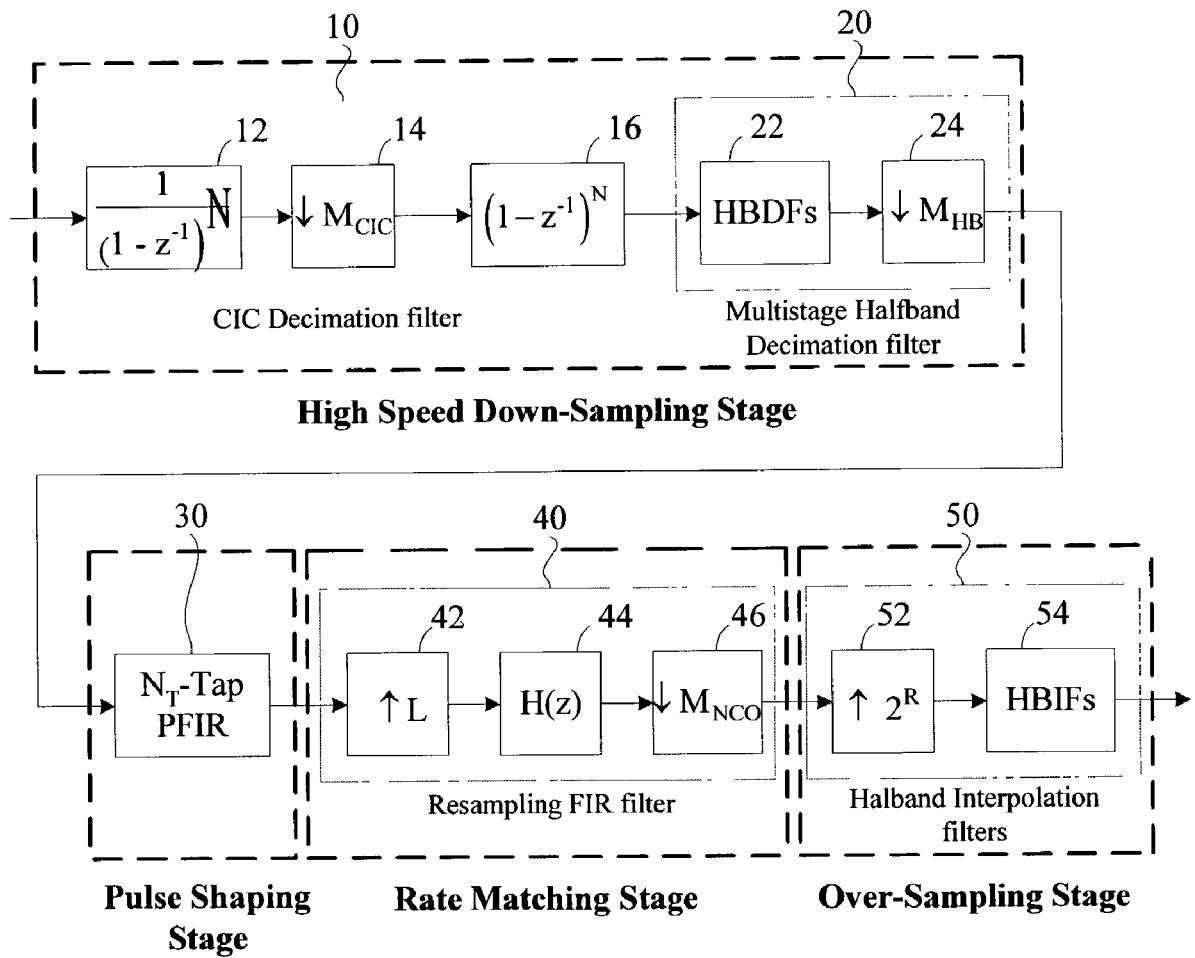
FIG. 1 shows a typical single channel digital IF programmable downconverter.

FIG. 1 shows a typical single channel digital IF programmable downconverter. In accordance with FIG. 1, a high speed down-sampling stage of the typical single channel digital IF programmable downconverter comprises a CIC decimation filter 10 and a multistage Halfband decimation filter; the spectral shaping stage comprises a programmable FIR filter 30; the rate matching stage is implemented by a re-sampling FIR filter 40; finally the oversampling stage comprises several Halfband interpolation filters 54 and interpolator 52.

Figure 2:
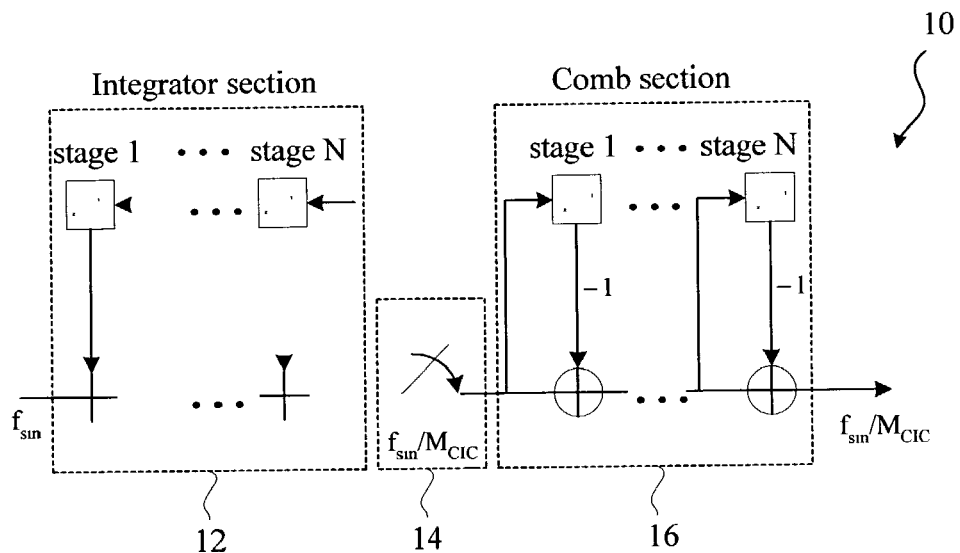
FIG. 2 shows the structure implementing CIC decimation filter.

FIG. 2 shows the structure implementing CIC decimation filter 10. Referring to FIG. 2, CIC Decimation filter 10 is consisted of two major portions: first portion comprises N integrators 12 in cascaded topology, the second portion comprises N comb filters 16 in cascaded topology as well. A decimator 14 separates the two portions. While the implementation of CIC Decimation filter doesn't need any multiplier and only limited storage is required, therefore VLSI implementation is particularly suitable for high data rate transmission. Moreover, the frequency response of CIC decimation filter is null at octave bands, where the signal will generate aliasing or imaging at the passband after going through the decimator. Therefore, it means that CIC decimation filter can provide natural alias-rejection capability. The number of cascaded stages of CIC decimation filter 10 is set to be N, and the decimation range is 1 to $M_{CIC,max}$.

Figure 3:
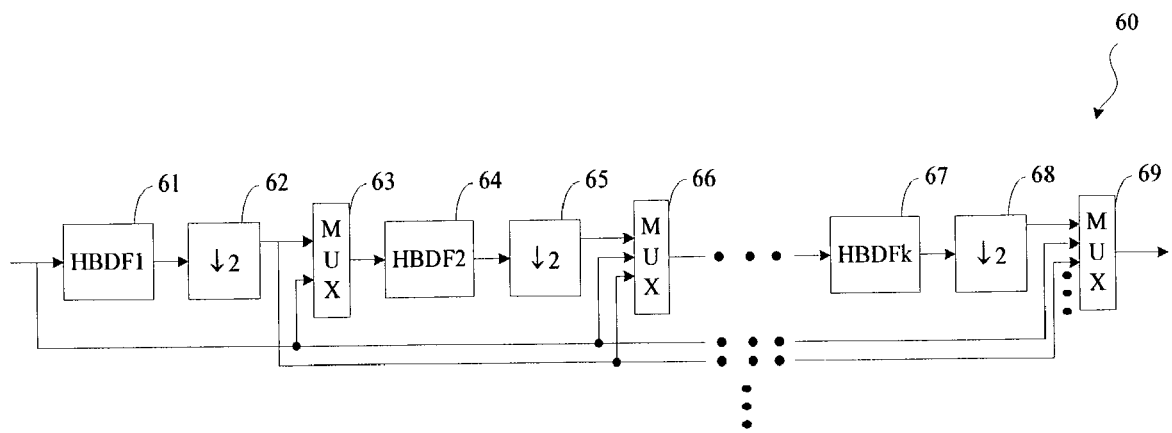
FIG. 3 shows the structure of a multi stage Halfband decimation filter.

Halfband filter is often implemented after the interpolation or decimation stage to remove aliasing and imaging. The spectral of Halfband filter is symmetric in the frequency domain, so the impulse response coefficient of Halfband filter will be 0 at intervals throughout the time domain, this characteristics is helpful in reducing half of the multiplying operations when implementing our design using Halfband filters. Multistage Halfband decimation filter 20 typically comprises a Halfband decimation filter 22 and a decimator 24. FIG. 3 shows the implementation of multistage Halfband decimation filter 60. Referring to FIG. 3, multistage Halfband decimation filter 60 comprises several Halfband decimation filters 61, 64 and 67, 2-to-1 decimators 62, 65 and 68, and cascaded multiplexers 63, 66 and 69. The coefficients of Halfband decimation filter 61, 64 and 67 are fixed and easy to implemented on specified hardware. Suppose the number of all available Halfband decimation filters is k, then the Halfband filters are denoted as HBDF1, HBDF2, . . . , HBDFk. Furthermore, the bandwidths and the number of taps of the above-mentioned k Halfband decimation filters are characterized in: (1) fp1<fp2<. . . <fpk, wherein fpi representing the bandwidth of HBDFi; (2) TD1<TD2<. . . <TDk, wherein TDi representing the number of taps of HBDFi. When we implement a multistage downconverting function for a given application, we need to select nHB Halfband decimation filters among k Halfband decimation filters based on the output bandwidth $f_{p,CIC}$ of CIC decimation filter to implement multistage downconverting.

Suppose D is the desired decimation factor of a typical digital IF programmable downconverter, then in a preferred embodiment of the present invention, the decimation factor $M_{CIC}$ of CIC decimation filter 10 and the decimation factor $M_{HB}$ of multistage Halfband decimation filter 20 should conform to the condition: $D=M_{CIC}M_{HB}$. And the best design guideline is to use as many Halfband decimation filters as possible to perform the downconverting function. The more Halfband decimation filters used, the larger the decimation factor $M_{HB}$ of multistage Halfband decimation filter 20 will be, therefore the decimation factor $M_{CIC}$ of CIC decimation filter 10 will be smaller. Meanwhile, the effect of aliasing generated by passing the signal through CIC decimation filter will be reduced, and the input signal sampling rate of programmable FIR filter 30 will be reduced as well, resulting in a less complex design.

Programmable FIR filter 30 provides the most design flexibility among all filter stages of the digital IF programmable downconverter. It carries out the functions of odd-symmetric filter, even-symmetric filter or complex filter to implement spectral shaping stage, where the passband bandwidth, transition band and stopband of the output signal meets the input specifications. Therefore, programmable FIR filter 30 is used in digital IF programmable downconverter to extract the minimum bandwidth of output data, wherein the output rate of programmable FIR filter 30 relates to the Nyquist sampling rate of the input data. In a preferred embodiment of the present invention, the available number of taps of programmable FIR filter 30 is $N_T$ and its decimation factor is fixed at 1, that is, programmable FIR filter 30 doesn't provide downconverting function. Consequently, the available number of taps used in every application is limited by the input signal sampling rate of programmable FIR filter 30 and the processing rate of the digital IF programmable downconverter.

Re-sampling FIR filter 40 is the only filter to provide non-integer decimation among all digital filters. Conceptually it can be visualized as comprising an interpolator 42 having a integration factor of L and a polyphase interpolation filter 44, followed by a NCO-controlled decimator 46. Re-sampling FIR filter 40 can adjust the output sampling rate of digital IF programmable downconverter to a non-integer multiple of the input signal sampling rate to meet user's requirements.

The oversampling stage 50 comprises several Halfband interpolation filters 54 and interpolator 52 to provide the oversampling capability of the digital IF programmable downconverter. In one aspect of the present invention, the available number of Halfband interpolation filters 54 is h, and the Halfband interpolation filters are denoted as HBIF1, HBIF2, . . . , HBIFh. Moreover, the numbers of taps of Halfband interpolation filters are characterized in: $TI_1>TI_2>\ldots >TI_h$, wherein $TI_1$ representing the number of taps of HBIFi. Halfband interpolation filters 54, along with interpolator 52, can provide interpolation of 2's multiples to compensate the time resolution deficiency problem caused by downconverting. On the other hand, due to the oversampling capability, the input signal sampling rate of programmable FIR filter 30 can be reduced, therefore the available number of taps of programmable FIR filter 30 is increased. More available number of taps of programmable FIR filter 30 will provide better results in spectral shaping.

Figure 4:
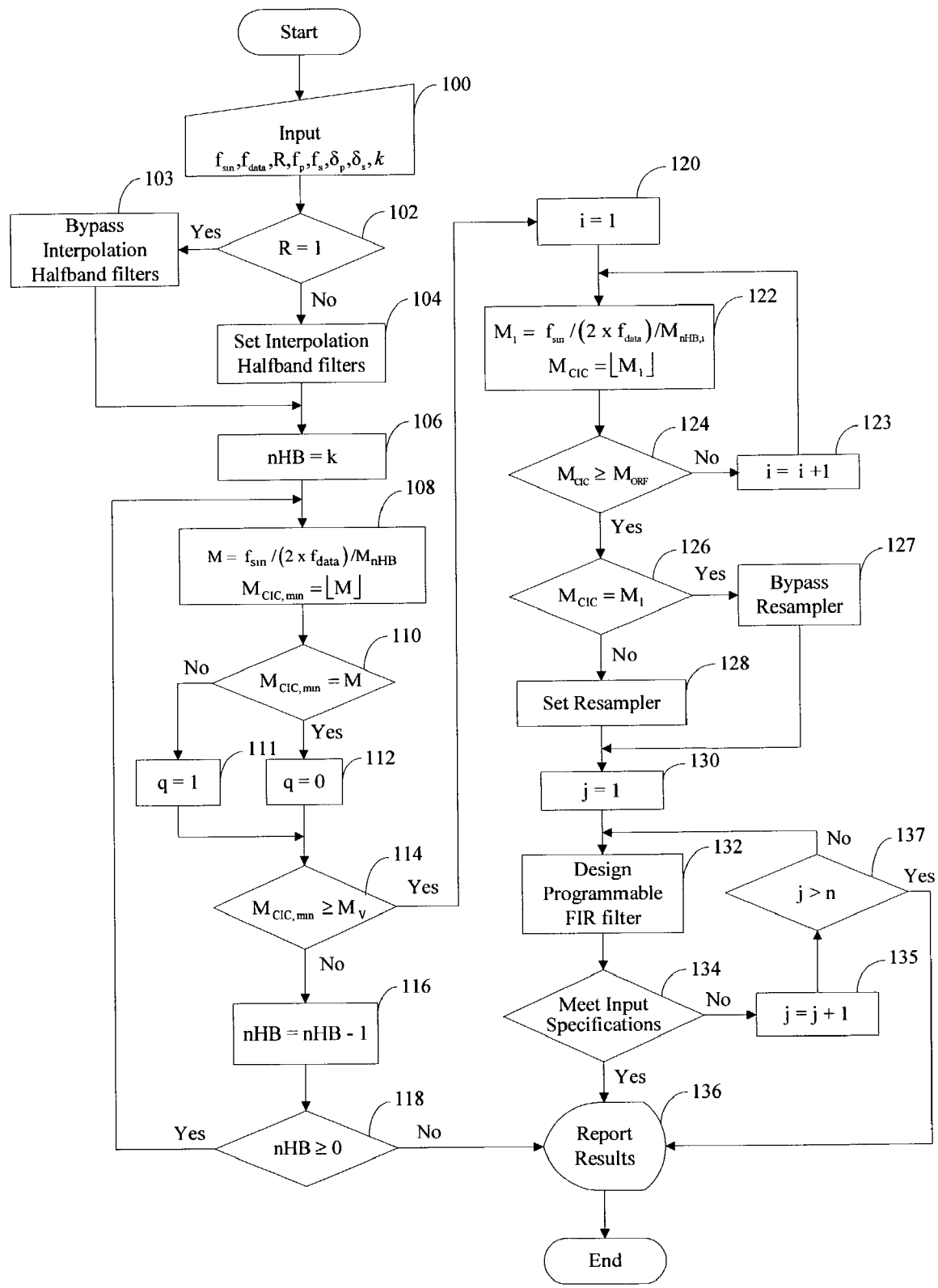
FIG. 4 illustrates a flow chart of an optimized filter parameters design for digital IF programmable downconverter.

Based on the above-mentioned typical digital IF programmable downconverter, the present invention provides an optimized filter parameters design to automatically meet the input specifications and hardware constraints. FIG. 4 shows the flowchart of an optimized filter parameters design for digital IF programmable downconverter. Detailed descriptions are as follows.

First receive input specifications 100, which includes input signal sampling rate $f_{sin}$, input data rate $f_{data}$, oversampling factor R ($1 \leq R \leq h$), available number k of Halfband decimation filters, passband frequency $f_p$, stopband frequency $f_s$, passband ripple $\delta_p$ and stopband attenuation $\delta_s$ of digital IF programmable downconverter. Then determine if oversampling factor R is 1 102 to see if it is necessary to use Halfband interpolation filters. If the answer is yes, set all Halfband interpolation filters as disabled 103; if the answer is no, set the number of enabled Halfband interpolation filter $N_{int}$ 104, wherein $N_{int}$ is derived from equation (1):

$$N_{int}=R-1 \tag{1}$$

According to input specifications, we can obtain the largest available number of Halfband decimation filters using the following steps: First set the initial value of the largest available number nHB of Halfband decimation filters as k 106, next, use input signal sampling rate $f_{sin}$, input data rate $f_{data}$ and the largest decimation factor $M_{nHB}$ of multistage Halfband decimation filter 108 in equation (2) to obtain the decimation factor M, wherein $M_{nHB}=2^{nHB}$. The minimum decimation factor $M_{CIC,min}$ of CIC decimation filter is less than or equal to the largest positive integer of the decimation factor M, which means $M_{CIC,min}=\lfloor M \rfloor$.

$$M=f_{sin}/(2*f_{data})/M_{nHB} \tag{2}$$

Next, determine if the minimum decimation factor $M_{CIC,min}$ of CIC decimation filter is equal to the decimation factor M 110. If the answer is yes, set the existing index q to 0 112, if the answer is no, set the existing index q to 1 111. The existing index q is used to determine if it is necessary to use re-sampling FIR filter for a given largest available number nHB of Halfband decimation filters.

Moreover, determine if the minimum decimation factor $M_{CIC,min}$ of CIC decimation filter is larger or equal to threshold $M_V$ 114, if not, subtract 1 from the largest available number nHB of Halfband decimation filters 116. Next, determine if value of nHB is bigger or equal to 0 118, if the answer is yes, then go back to step 108 and repeat the above-mentioned steps; if not, generate a result 136 to inform user that no filter configuration satisfies the input specification.

The threshold $M_V$ of CIC decimation filter is the maximum between threshold $CLK_{TH}$ and $CLK_{nHB,min}$, as depicted in equation (3):

$$M_V=\max(CLK_{TH}, CLK_{nHB,min}) \tag{3}$$

Threshold $CLK_{TH}$ is obtained from the following steps. Based on existing index q and input oversampling factor R, obtain the total clock cycles $CLK_R$ by equation (4):

$$CLK_R=CLK_{res} \times q+N_L \tag{4}$$

wherein $CLK_{res}$ is the clock cycles needed for using re-sampling FIR filter, $N_L$ is the clock cycles needed for using $N_{int}$ Halfband interpolation filters, $N_L$ is derived from equation (5):

$$N_L = \sum_{i=1}^{N_{int}} 2^{i-1}\left(\frac{TI_i-3}{4}+2\right) \tag{5}$$

In equation (5), TIi represents the number of taps of HBIFi. And threshold $CLK_{TH}$ is obtained from equation (6), wherein $M_{nHB}=2^{nHB}$ is the largest decimation factor of multistage Halfband decimation filter.

$$CLK_{TH}=CLK_R/M_{nHB} \tag{6}$$

Another threshold $CLK_{nHB,min}$ is the minimum clock cycles needed for the largest available number nHB of Halfband decimation filters, from equation (7):

$$CLKnHB, mm = \begin{cases} \sum_{i=1}^{nHB}\left(\frac{TDi-3}{4}+2\right)/2^{i-1}, & nHB > 0 \\ 1, & nHB = 0 \end{cases} \tag{7}$$

wherein TDi represents the number of taps of HBDFi.

Back to step 114 on the flowchart, if the minimum decimation factor $M_{CIC,min}$ of CIC decimation filter is larger or equal to threshold $M_V$, then jump to step 120, wherein the value of nHB at this moment is the largest available number of Halfband decimation filters.

Based on the largest available number nHB of Halfband decimation filters, we can have one or more possible combinations of Halfband decimation filters. Consequently, according to the alias rejection capability, passband attenuation and full dynamic range bandwidth of each combination of Halfband decimation filters, assign a priority to each combination. Assign priority index i=1 to the optimized combination, priority index i=2 to the runner-up and so on. Therefore, the optimized parameters of Halfband decimation filters and CIC decimation filter are obtained from the following steps.

The search begins from the combination of Halfband decimation filters having priority index as 1, that is, starting from the optimized combination of Halfband decimation filters. Next, obtain the decimation factor $M_1$ 122 by using input signal sampling rate $f_{sin}$, input data rate $f_{data}$ and the decimation factor $M_{nHB,i}$ of the ith combination of Halfband decimation filters in equation (8), wherein:

$$M_1=f_{sin}/(2 \times f_{data})/M_{nHB,i}, M_{nHB,i}=2^{nHB,i} \tag{8}$$

Here nHB,i represents the number of Halfband decimation filters of the ith combination. And the decimation factor $M_{CIC}$ of CIC decimation filter is less than or equal to the largest positive integer of decimation factor $M_1$, represented as $M_{CIC}=\lfloor M_1 \rfloor$.

Furthermore, compare the decimation factor $M_{CIC}$ of CIC decimation filter with a threshold $M_{ORF}$ 124, determine if the ith combination of Halfband decimation filters meets the hardware constraints of digital IF programmable downconverter. The threshold $M_{ORF}$ is an overclock rate factor of the ith combination of Halfband decimation filters, wherein the value of $M_{ORF}$ relates to enabled Halfband decimation filters, from equation (9):

$$M_{ORF} = \sum_{i=k}^{1} (HBDFi) 2^{\sum_{j=k}^{1} HBDFj} \left( \frac{TD_i - 3}{4} + 2 \right) \bigg/ 2^{nHB,1} \quad (9)$$

if the jth Halfband decimation filter is enabled, then HBDFj=1, else HBDFj=0. The first combination of Halfband decimation filter that satisfies the condition that the decimation factor $M_{CIC}$ of CIC decimation filter is larger than or equal to threshold $M_{ORF}$, will be chosen as the optimized combination of Halfband decimation filters. The optimized combination along with the corresponding CIC decimation filter will be the optimized parameters design.

If the decimation factor $M_{CIC}$ of CIC decimation filter is less than threshold $M_{ORF}$, then add 1 to priority index i 123, that is, go back to step 122 and repeat the above-mentioned search again, try the second optimized combination of Halfband decimation filters. On the other hand, if the decimation factor $M_{CIC}$ of CIC decimation filter is larger than or equal to threshold $M_{ORF}$, determine if the decimation factor $M_{CIC}$ of the CIC decimation filter is equal to decimation factor $M_1$ 126. If the answer is no, enable re-sampling FIR filter 128 and set the output rate of re-sampling FIR filter to twice as the input data rate $f_{data}$, if the answer is yes, set the re-sampling FIR filter as disabled 127.

In the above-mentioned steps, the optimized design of Halfband interpolation filter, CIC decimation filter, Halfband decimation filters and re-sampling FIR filter is obtained. Moreover, n window functions of filters are used to design $N_T$-Tap programmable FIR filter to meet the spectral requirements. First, determine the number of available taps of programmable FIR filter; set j to be the index of n window functions. The search process starts with the first window function, so set the initial value of j to 1 130. Based on the jth windows function, generate the coefficient of programmable FIR filter 132 and check if the resulted synthesized frequency response satisfies the input specifications 134. If the answer is yes, generate a result 136 to inform user the design results of all filters and terminate the search process. If the answer is no, add 1 to window function index j 135, then check if the index j is greater than the total n of window function 137, if the answer is yes, generate a result 136 to inform user that no window function satisfies the input specifications, if no, go back to step 132 and repeat the above-mentioned design steps, the search process will try another window function.

The present invention discloses an optimized filter parameters design for digital IF programmable downconverter, it is advantageous in:

1. The present invention discloses an optimized filter parameters design for digital IF programmable downconverter, based on user's requirements, such as input signal sampling rate, input data rate, oversampling factor, available number of Halfband decimation filter, passband frequency, stopband frequency, passband ripple and stopband attenuation, to automatically design the parameters of CIC decimation filter, Halfband decimation filter, programmable FIR filter, re-sampling FIR filter and Halfband interpolation filter of a typical single channel digital IF programmable downconverter having output signal bandwidth and data rate satisfying the input specifications.

2. The present invention provides an optimized filter parameters design for digital IF programmable downconverter to implement digital IF techniques using digital downconverters and to avoid the complexity and difficulty in designing various filter stages.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for finding an optimized filter parameters design for a digital IF programmable downconverter, comprises the following steps:
   (1) receiving an input specification, said input specification comprising an input signal sampling rate, an input data rate, an oversampling factor R, an available number of Halfband decimation filters, a passband frequency, a stopband frequency, a passband ripple, a stopband attenuation and a optimal filter parameter satisfying said input specification;
   (2) determining if said oversampling factor R is equal to 1;
   (3) obtaining an largest available number nHB of Halfband decimation filters and setting an initial value of nHB equal to a total of Halfband decimation filters;
   (4) obtaining an largest available first number of Halfband decimation filters satisfying said input specification and determining if re-sampling FIR filter is necessary;
   (5) obtaining an optimized combination of Halfband decimation filters satisfying said input specification;
   (6) obtaining a total n of window function for designing filters;
   (7) obtaining a window function index j and setting said windows function index to 1; and
   (8) obtaining a programmable FIR filter satisfying said input specification.

2. The method of claim 1, wherein the step (4) further comprises the following steps:
   A: estimating a decimation factor M based on said largest available number nHB of Halfband decimation filters and obtaining a minimum decimation factor $M_{CIC,min}$ of CIC decimation filter;
   B: determining if said minimum decimation factor $M_{CIC,min}$ of CIC decimation filter is equal to said decimation factor M; and
   C: obtaining a decimation factor threshold $M_V$ of CIC decimation filter and determining if said minimum decimation factor $M_{CIC,min}$ of CIC decimation filter is larger or equal to said decimation factor threshold $M_V$ of CIC decimation filter.

3. The method of claim 2, wherein in step C if $M_{CIC,min}$ is less than $M_V$, subtracting 1 from said largest available number nHB of Halfband decimation filters and determining if said nHB is larger or equal to O.

4. The method of claim 2, wherein said decimation factor M obtained from said largest available number nHB of Halfband decimation filters is further obtained by dividing said input signal sampling rate by twice said input data rate, then divided by a decimation factor $M_{nHB}$ of Halfband decimation filter having said largest available number nHB, wherein MnHB=$2^{nHB}$.

5. The method of claim 2, wherein said minimum decimation factor $M_{CIC,min}$ of CIC decimation filter is less than or equal to a positive integer of said decimation factor M obtained from said largest available number nHB of Halfband decimation filter.

6. The method of claim 1, wherein the step (5) further comprises the following steps:

A: estimating a decimation factor $M_1$ based on a combination number nHB,i of Halfband decimation filters having a priority index i and obtaining a decimation factor $M_{CIC}$ of CIC decimation filter;

B: obtaining a combination threshold $M_{ORF}$ of Halfband decimation filters having said priority index i; and C: determining if said decimation factor $M_{CIC}$ of CIC decimation filter is larger or equal to said combination threshold $M_{ORF}$ of Halfband decimation filters having said priority index i.

7. The method of claim 6, wherein if step C is true, then determining if said decimation factor $M_{CIC}$ of CIC decimation filter is equal to said decimation factor $M_1$.

8. The method of claim 6, wherein said decimation factor $M_1$ obtained from said combination number nHB,i of Halfband decimation filters having a priority index I is further obtained from dividing said input signal sampling rate by twice said input data rate, then divided by said decimation factor $M_{nHB,i}$ of Halfband decimation filter having said combination number nHB,i of Halfband decimation filters and said priority index i, wherein $M_{nHB,i} = 2^{nHB,i}$.

9. The method of claim 6, wherein said decimation factor $M_{CIC}$ is less than or equal to a largest positive integer of said decimation factor $M_1$ obtained from said combination number nHB,i of Halfband decimation filter having said priority index i.

10. The method of claim 1, wherein the step (8) generating a coefficient of said programmable FIR filter based on said window function of window function index j and determining if a synthesized frequency response of said digital IF programmable down-converter satisfying said input specification.

11. The method of claim 10, wherein if said synthesized frequency response is not satisfying said input specification, add 1 to said window function index j and determine if said window function index j is greater than said total n of window function.

12. A method for finding an optimized filter parameters design for a digital IF programmable downconverter, comprises the following steps:

(1) receiving an input specification, said input specification comprising an input signal sampling rate, an input data rate, an oversampling factor R, an available number of Halfband decimation filters, a passband frequency, a stopband frequency, a passband ripple, a stopband attenuation and a optimal filter parameter satisfying said input specification;

(2) determining if said oversampling factor R is equal to 1;

(3) obtaining an largest available number nHB of Halfband decimation filters and setting an initial value of nHB equal to a total of Halfband decimation filters;

(4) obtaining an largest available first number of Halfband decimation filters satisfying said input specification and determining if re-sampling FIR filter is necessary;

(5) obtaining an optimized combination of Halfband decimation filters satisfying said input specification;

(6) obtaining a total n of window function for designing filters;

(7) obtaining a window function index j and setting said windows function index to 1; and (8) obtaining a programmable FIR filter satisfying said input specification; wherein the step (4) further comprises the following steps:

A: estimating a decimation factor M based on said largest available number nHB of Halfband decimation filters and obtaining a minimum decimation factor $M_{CIC,min}$ of CIC decimation filter;

B: determining if said minimum decimation factor $M_{CIC,min}$ of CIC decimation filter is equal to said decimation factor M; and C: obtaining a decimation factor threshold $M_V$ of CIC decimation filter and determining if said minimum decimation factor $M_{CIC,min}$ of CIC decimation filter is larger or equal to said decimation factor threshold $M_V$ of CIC decimation filter; wherein the obtaining said decimation factor threshold $M_V$ of CIC decimation filter step further comprises the following steps:

(1) obtaining a total clock cycle $CLK_R$ of re-sampling FIR filters and Halfband interpolation filters based on an existing index q and a oversampling factor R, wherein $COK_R = CLK_{res} \times q + N_L$ (2) obtaining a threshold $CLK_{TH}$ of re-sampling FIR filters and Halfband interpolation filters by dividing said total clock cycle $CLK_R$ of re-sampling FIR filters and Halfband interpolation filters by said decimation factor $M_{nHB}$ of Halfband decimation filter having said largest available number nHB;

(3) estimating a minimum clock cycle $CLK_{nHB,min}$ of all combinations of Halfband decimation filter having said largest available number nHB by:

$$CLKnHB, mm = \begin{cases} \sum_{i=1}^{nHB} \binom{TDi-3}{4} + 2 \Big/ 2^{i\cdot 1}, & nHB > 0 \\ 1, & nHB = 0 \end{cases}$$

(4) obtaining said decimation factor threshold $M_V$ of CIC decimation filter by determining a maximum between said threshold $CLK_{TH}$ of re-sampling FIR filters and Halfband interpolation filters and said minimum clock cycle $CLK_{nHB,min}$ of all combinations of Halfband decimation filter having said largest available number nHB.

13. A method for finding an optimized filter parameters design for a digital IF programmable downconverter, comprises the following steps:

(1) receiving an input specification, said input specification comprising an input signal sampling rate, an input data rate, an oversampling factor R, an available number of Halfband decimation filters, a passband frequency, a stopband frequency, a passband ripple, a stopband attenuation and a optimal filter parameter satisfying said input specification;

(2) determining if said oversampling factor R is equal to 1;

(3) obtaining an largest available number nHB of Halfband decimation filters and setting an initial value of nHB equal to a total of Halfband decimation filters;

(4) obtaining an largest available first number of Halfband decimation filters satisfying said input specification and determining if re-sampling FIR filter is necessary;

(5) obtaining an optimized combination of Halfband decimation filters satisfying said input specification;

(6) obtaining a total n of window function for designing filters;

(7) obtaining a window function index j and setting said windows function index to 1; and (8) obtaining a programmable FIR filter satisfying said input specification; wherein the step (5) further comprises the following steps:

A: estimating a decimation factor $M_1$ based on a combination number nHB,i of Halfband decimation filters having a priority index i and obtaining a decimation factor $M_{CIC}$ of CIC decimation filter;

B: obtaining a combination threshold $M_{ORF}$ of Halfband decimation filters having said priority index i; and C: determining if said decimation factor $M_{CIC}$ of CIC decimation filter is larger or equal to said combination threshold $M_{ORF}$ of Halfband decimation filters having said priority index i; wherein said combination threshold $M_{ORF}$ of Halfband decimation filters having said priority index i is an overclock rate factor of said combinations of Halfband decimation filters having priority index i, said $M_{ORF}$ is obtained by:

$$M_{ORF} = \sum_{i=k}^{1} (HBDFi) 2^{\sum_{j=k}^{1} HBDFj} \left( \frac{TD_i - 3}{4} + 2 \right) \bigg/ 2^{nHB,1}$$

* * * * *